US008103987B2

(12) United States Patent
Banerjee et al.

(10) Patent No.: US 8,103,987 B2
(45) Date of Patent: Jan. 24, 2012

(54) SYSTEM AND METHOD FOR MANAGING THE DESIGN AND CONFIGURATION OF AN INTEGRATED CIRCUIT SEMICONDUCTOR DESIGN

(75) Inventors: Soumya Banerjee, San Jose, CA (US); Todd Michael Bezenek, San Jose, CA (US); Clement Tse, Fremont, CA (US)

(73) Assignee: MIPS Technologies, Inc., Sunnyvale, CA (US)

( * ) Notice: Subject to any disclaimer, the term of this patent is extended or adjusted under 35 U.S.C. 154(b) by 406 days.

(21) Appl. No.: 11/684,156

(22) Filed: Mar. 9, 2007

(65) Prior Publication Data

US 2008/0222580 A1 Sep. 11, 2008

(51) Int. Cl.
*G06F 17/50* (2006.01)

(52) U.S. Cl. ....... 716/100

(58) Field of Classification Search ....... 716/1, 18, 716/100

See application file for complete search history.

(56) References Cited

U.S. PATENT DOCUMENTS 5,634,012 A 5/1997 Stefik et al.
6,157,947 A 12/2000 Watanabe et al.
6,477,683 B1 11/2002 Killian et al.
6,477,697 B1 11/2002 Killian et al.
6,668,360 B1 12/2003 Liu
6,862,563 B1 3/2005 Hakewill et al.
7,194,599 B2 3/2007 Hudepohl et al.
7,243,311 B2 7/2007 Mabuchi et al.
7,284,225 B1 * 10/2007 Ballagh et al. ....... 716/16
7,409,652 B1 8/2008 Fox et al.
7,774,723 B2 8/2010 Banerjee
2003/0005396 A1 1/2003 Chen et al.
2003/0055520 A1 3/2003 Tomii
2004/0006544 A1 1/2004 Gulett
2004/0073899 A1 * 4/2004 Luk et al. ....... 717/158
2004/0098569 A1 * 5/2004 Smith et al. ....... 712/229
2004/0107214 A1 6/2004 Hung et al.
2004/0250231 A1 * 12/2004 Killian et al. ....... 716/18
2004/0255152 A1 12/2004 Kanamori et al.
2005/0246287 A1 11/2005 Lee
2005/0278682 A1 * 12/2005 Dowling ....... 716/18
2006/0074506 A1 4/2006 Braun et al.
2006/0075374 A1 4/2006 McElvain
2007/0266373 A1 11/2007 Liu et al.
2008/0208886 A1 8/2008 Zhang
2008/0222581 A1 9/2008 Banerjee
2009/0235241 A1 * 9/2009 Luk et al. ....... 717/153

OTHER PUBLICATIONS

Ryu and Mooney, Automated Bus Generation for Multiprocessor SoC Design, Proceedings of the Design, Automation and Test in Europe Conference and Exhibition, IEEE, 2003, 6 pages.

(Continued)

*Primary Examiner* — Suchin Parihar
(74) *Attorney, Agent, or Firm* — Kilpatrick Townsend & Stockton LLP; Ardeshir Tabibi

(57) ABSTRACT

A system and methods that facilitate the design process and minimize the time and effort required to complete the design and fabrication of an integrated circuits (IC) are described. The system and method utilize a plurality of repositories, rules engines and design and verification tools to analyze the workload and automatically produce a hardened GDSII description or other representation of the device. The system and method securely maintains synthesizable RTL on a server in a data center while providing designers access to portions of the mechanism by way of a network portal.

28 Claims, 11 Drawing Sheets

OTHER PUBLICATIONS

Schirnet and Domer, Quantitative Analysis and Transaction Level Models for the AMBA Bus, EDAA, 2006, at pp. 230-235.

Santarini, IP plays cautiously in emerging markets, EDN, Nov. 9, 2006, 6 pages beginning at p. 99.

De Sutter, Van Put, Chanet, De Bus and De Bosschere, Link-Time Compaction and Optimization of ARM Executables, ACM Transactions on Embedded Computing Systems, vol. 6, No. 1, Article 5, Feb. 2007, 43 pages.

Business Editor/High-Tech Writers, "Synplicity Delivers Seamless Support for Off-the-Shelf ASIC," Mar. 4, 2002, Business Wire, 5 pages, Business Wire, N.Y.

Non-Final Office Action for U.S. Appl. No. 11/684,205, mailed on Dec. 12, 2008, 13 pages.

Non-Final Office Action for U.S. Appl. No. 11/684,205, mailed on Jul. 17, 2009, 10 pages.

Notice of Allowance for U.S. Appl. No. 11/684,205, mailed on Apr. 2, 2010, 8 pages.

Non-Final Office Action for U.S. Appl. No. 11/684,189, mailed on Jun. 29, 2010, 27 pages.

Luculli, G., An ISA-Retargetable Framework for Embedded Software Analysis, 10th IEEE Int'l. Conf. and Workshop on the Engineering of Computer-BasedSystems2003, pp. 183-190.

Halfhill et al, ARC Patent Looks Formidable, Microprocessor Reports, Aug. 2005, 9 pages.

Halfhill, MIPS Embraces Configurable Technology, Microprocessor Reports, Mar. 2003, 9 pages.

Halfhill, More Patents for Tensilica, Microprocessor Reports, May 2006, 4 pages.

* cited by examiner

SYSTEM AND METHOD FOR MANAGING THE DESIGN AND CONFIGURATION OF AN INTEGRATED CIRCUIT SEMICONDUCTOR DESIGN

FIELD OF THE INVENTION

The invention relates generally to the field of integrated circuits (IC) design. More specifically the present invention relates to a mechanism for facilitating the design process of an IC.

DESCRIPTION OF RELATED TECHNOLOGY

The System-on-Chip (SoC) industry has developed rapidly over the last several years from producing VLSI devices that integrate a processor, memory and a few peripheral components onto a single chip to today's complex, high-performance SoCs that incorporate hundreds of intellectual property (IP) blocks. Complex systems have always been hard to build and debug. Systems-on-chip are no different in this respect, but the economics of integrated circuit manufacture do not allow debugging by trial and error; the design must be 'right first time'. As a result, SoC designers must minimize the risk of design error because any design iteration will be expensive in both mask charges and time to market.

Several types of computer-aided design (CAD) tools are available to aid in the design and fabrication of SoCs. Such computer-aided design tools can address both the synthesis and optimization processes. Synthesis is generally defined as an automatic method of converting a higher level of abstraction to a lower level of abstraction.

The synthesis process generally begins with the designer compiling a set of system specifications based on the desired functionality of the SoC. These specifications are then encoded in a hardware description language (HDL) such as VHDL. (VHSIC hardware description language) available from IEEE of New York, N.Y., or Verilog available from Cadence Design Systems, Inc. of Santa Clara, Calif. These specifications can be used to define a SoC in terms of the desired inputs and outputs, as well as desired functionality such as available memory or clock speed. From the HDL, the designer then generates a "netlist"including a list of gates and their interconnections, which is descriptive of the circuit modules in the SoC. Ultimately, the design is compiled and masks fabricated for producing the physical SoC.

While well suited for simpler devices and single components, the aforementioned synthesis process suffers several limitations, especially when applied to the design of complex SoCs. One effort to address these limitations is disclosed in U.S. Pat. No. 6,862,563 (the '563 reference) the disclosure of which is incorporated herein by reference for all purposes. The '563 reference attempts to configure one critical IP block, primarily a processor core, using an interactive computer program to manage the process and to improve efficiency of the SoC.

While the ability to optimize a customized processor core design in a SoC application is helpful in certain applications, there is still the requirement of back-fitting computer code such as operating system and application programs to execute on the customized processor core. Thus, regardless of the advantages of the prior art, what is needed is a synthesis process that minimizes the time and effort to design and manufacture a SoC with one or more processors whose specification is in part determined by the necessity to provide an expected level of performance for the computer code.

SUMMARY OF THE INVENTION

The present invention satisfies the aforementioned needs by providing an automated means of managing the complete configuration of an integrated circuit design (IC) and in particular a complex system on a chip (SoC).

A first aspect of the invention discloses an improved method for managing the design and configuration of a SoC. The method provides for the automated description of hardware components, such as a processor core, and software components, such as application and operating software, as well as the integration of the hardware and software components.

In a second aspect of the invention, a menu-driven computer program implements the design and configuration management method. In one exemplary embodiment, an interactive architecture module gathers workload information about the SoC and generates a merged HDL file descriptive of the design. In addition to generating the description file, the method provides for modification of the description file in response to an analysis of the operating system and application level software.

In a third aspect of the invention, an apparatus for generating, simulating, and/or synthesizing a SoC design using the aforementioned method is disclosed that allows a SoC designer to remotely interact with the program during the design, simulation, and/or synthesis processes.

In a fourth aspect of the invention, a SoC design depicted in a hardware description language and synthesized using the aforementioned method of the invention is disclosed.

In a fifth aspect of the invention, an IC fabricated using the aforementioned synthesized design is disclosed. In one exemplary embodiment, the IC comprises a SoC with one or more processors.

DETAILED DESCRIPTION OF THE INVENTION

Reference is now made to the drawings wherein like numerals refer to like parts throughout.

Figure 1:
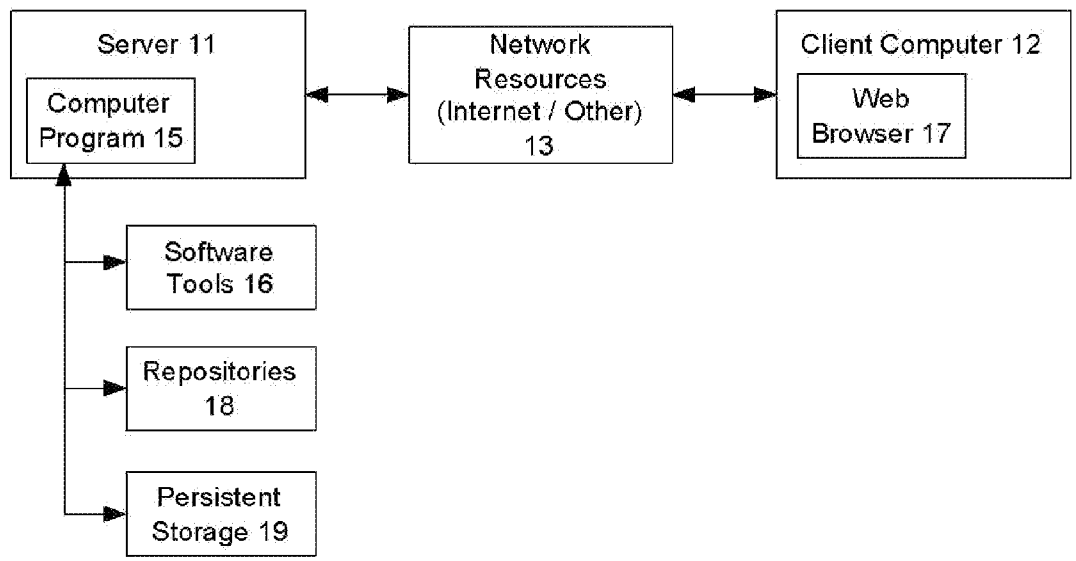
FIG. 1 is a block diagram illustrating an integrated circuit design and synthesis method in accordance with an embodiment of the present invention.

As illustrated in FIG. 1, the present invention for managing the design and configuration of a system on a chip (SoC) or other silicon design takes, in one embodiment, the form of a server 11 coupled to at least one client computer 12 by a network 13 such as the Internet. The method provides for the automated description of hardware components, such as a processor core, specialized processors, buses and controllers, and software components, such as application and operating software, as well as the integration of the hardware and software components.

A silicon-on-chip (SoC) designer accesses server-resident computer program 15 and software tools 16 using a web browser 17 installed on client computer 12. It will be appreciated, that server 11 may be one server in a data center environment or the functions described herein may be distributed among a plurality of servers to load balance or to cache portions of the computer code and tools to improve access or to provide redundancy. The server resident computer program 15 interfaces with software tools 16 and repositories 18 to generate a description file which is a synthesizable "soft"version of a design. Computer program 15, software tools 16 and repositories 18 are all retained on a persistent storage device 19 that is capable of storing computer readable information. Persistent storage device 19 may be either coupled to or is a component of server 12. Software tools 16 may further include synthesis and formal verification tools.

As used herein, the term "computer program" describes any series of logical steps performed in a sequence to accomplish a given purpose. In operation, one or more designers access computer program 15 through browser 17 and network 13 to specify the specifications and functionality of the device.

Since the design of a new device typically requires control and application software, computer program 15 further provides for the analysis of such software during generation of a description file to optimize the design. As described herein, designers may access various software tools 16 at appropriate times during the design process for configuration and optimization of the hardware and software design.

Advantageously, the present invention automates the management of the remote complete configuration of an integrated circuit design (IC) and in particular a SoC device. The remote feature means that confidential trade secret information regarding proprietary intellectual property (IP) blocks need not be transferred off-site to computer equipment controlled by the designer. Rather the owner of the IP or a trusted third party can provide limited access to the design, verification and simulation tools and provide the results of the design directly to the semiconductor foundry on behalf of the designer.

Thus, the present invention provides an improved and more secure method for managing the design and configuration of a SoC or other IC device. The method provides the automated description of hardware components, such as a processor core, bus and memory, and software components, such as application and operating software, as well as the integration of the hardware and software components.

Figure 2:
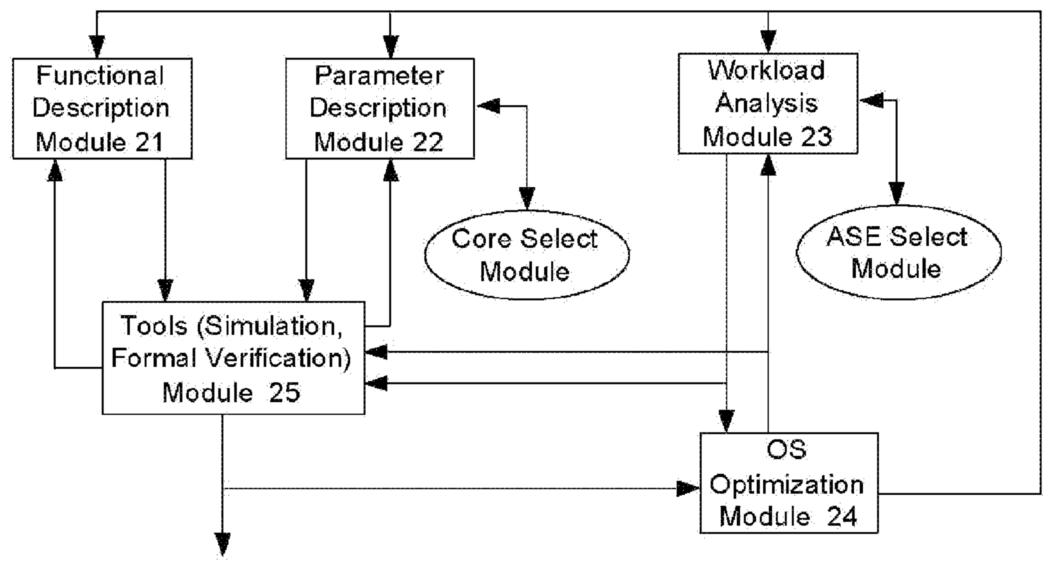
FIG. 2 is a block diagram illustrating a system for developing a description file of an integrated circuit in accordance with an embodiment of the present invention.

FIG. 2 illustrates one embodiment of computer program 15 that a designer can use to develop the description file. Computer program 15 includes a functional description module 21 that guides the designer to develop a high-level or macro description of the device. In one embodiment, the description includes a functional description of the device that is generated through a series of menus presented as a graphical user interface (GUI) displaying a series of high level functional block components. Computer program 15 also includes the capability to upload design scripts that describe customized elements created by the designer. This feature promotes inclusion of specifications from multiple IP vendors into the SoC design flow.

A second module 22, the parameter description module, guides the developer in defining the performance requirements for the functional blocks. Module 22 provides a GUI for selecting, by way of example, optimal clock operating frequencies, power levels and maximum allowed power dissipation, die size, and I/O requirements. One skilled in the art will appreciate that other operating parameters can be readily included in module 22. Module 21 utilizes these parameters to optimize the selection of functional block components.

Module 22 enables the designer to select performance characteristics that are not otherwise determinable from the functional description without having to understand the performance characteristic of each component. Performance characteristics may include, by way of example, operating clock frequency, gate count, target die size, maximum power dissipation, operating voltage, foundry design rules and the like. One skilled in the art will appreciate that it is also possible to specify other characteristics to granularly define system performance characteristics. For example, the designer may specify that the processor data path be either 32-bits or 64-bits wide or that the instruction length be 16-bits, 32-bits or a combination of both lengths. The designer may also specify whether multi-threading or multiple cores are required to meet the performance specification of the device.

A third module 23, the workload analysis module, accepts algorithms or other specifications, such as application programming code, that describe the workload targeted for the hardware platform and performs an analysis to determine areas of the code that could generate high processing loads. As used herein, workload encompasses algorithms that may be specified as a flowchart, a C or C++ program or set of programs in other programming languages that specifies device requirements. Information from module 23 is also passed to module 21 and module 22 to optimize the selection of functional block components. Module 21-23 allows the designer to select a certain configuration, e.g., two or four cores to evaluate the power/area/performance of the selected configuration for a given workload.

In one embodiment, module 23 is a complier that analyses code to identify potential bottlenecks. One such suitable, but limited, compiler, C to Hardware Acceleration Complier, is commercially available from Altera Corporation. Preferably module 23 also includes a formal verification tool to prove that the computer code does exactly what is stated in a program specification.

A fourth module 24 of computer program 15, the operating system optimization module, is used to optimize the footprint, performance, and other characteristics, such as MB/sec data forwarding throughput, Dhrystone MIPS, EEMBC performance, etc., of the operating system and middleware, if any, that will typically be stored in nonvolitile memory on the device or in an off-chip persistent storage device. Module 24 preferably performs both a static and a dynamic analysis of the workload from the perspective of the operating system. Dynamic analysis is preferably performed by one or more simulation tools. Module 24 interfaces with modules 23-21 to determine whether it is preferable to implement certain functions in software rather than hardware. Module 24 may further function to determine the software algorithm to use for a specific application. For example, a table driven algorithm may be faster but would require additional memory to be added to the device. Module 24 may further function to determine the level of software optimization (for example, compiling for space by selecting a compile-time option to compile for a minimal codes size and a compressed instruction set versus selecting a compile time option to compile for performance of the generated code. Module 24 may yet further function to optimize the size of scratchpad memory and the assignment of code or data to scratchpad memory or main memory.

For example, in one embedded application, the application software may perform significant number of multiplication operations so a hardware multiplication is the preferred implementation thereby minimizing the need for the operating system to include a multiplication algorithm. In another embedded application where the application software seldom performs the multiplication operation, it is area and power efficient to implement the multiplication operation in software rather than in hardware even if it will take significantly longer to perform the multiplication when the need arises.

Using the descriptions generated by modules 21, 22 and 23, module 25 of computer program 15 assembles a description file that comprises a series of predefined VHDL, Verilog, System Verilog or other synthesizable constructs of an HDL. The description file is then stored on persistent storage device 19. The description file specifies the functional requirements of the device in terms of the components and the overall operational characteristics in RTL or other programmable form that is readily converted to RTL.

During the simulation and verification, software tools 16 interactively perform design rules checks and flag errors that may arise from incompatible functional specifications when activated by the designer. Based on the components selected by the designer, a self-checking testbench is generated by module 25 to exercise the inputs with a set of designer-supplied test vectors. Timing simulation is preferably done after device layout to determine if the design works at the parameters (e.g. clock rate and power) specified by the designer. Accordingly, during the design process, the designer will access computer program 15 in an iterative manner during the design process.

Full-system simulation of the design ensure that it will support the workload as analyzed and parameterized by modules 23 and 24. If not, the process iterates by providing information about the actual performance compared to the specified required performance. Additionally, if the system performs significantly better than necessary, the process can also iterate. Using this feedback, the system is verified to perform as specified and to do so with a minimal solution in terms of cost, power or other optimizing parameter. It should be noted, with reference to FIG. 2, that in an embodiment of the present invention, feedback from module 25 is routed to both modules 23 and 24.

Hence, the computer program 15 initiates the creation and testing of HDL-based synthesizable SoCs. This approach provides designers with a great deal of flexibility in configuring the specific functional attributes of the resulting SoC.

Module 25 also performs logic synthesis to compile and optimize the high-level circuit description and generate a gate-level netlist representation of the device. In one embodiment, module 25 includes a compiler such as the Design Compiler, which is commercially available from Synopsys, Inc. Preferably, module 25 also includes at least one validation tool to verify that the design does what the designer actually intended and a verification tool to verify that the design conforms to the specifications developed by the designer using modules 21-24.

The menu-driven computer program 15 advantageously implements the design and configuration management method that prevents the disclosure of IP blocks to the designer. Advantageously, in one exemplary embodiment, computer program 15 comprises an interactive architecture module that gathers information regarding the design parameters of the SoC and generates a merged HDL file descriptive of the design that complies with those design parameters. In addition to generating the description file, the method provides for modification of the description file in response to an analysis of the operating system and application level workload features and functionality.

In embodiments of the present invention, one or more of the modules can be selectively accessed while other modules are ignored. For example, modules 22 and 24 can be omitted from the design process. In other embodiments, operating system functionality can be specified and the design of the device optimized in view of the selected operating system functionality. In other embodiments, all of the modules 21-25 may be selectively accessed on one or more iterations of the design, verification and synthesis process.

Figure 3:
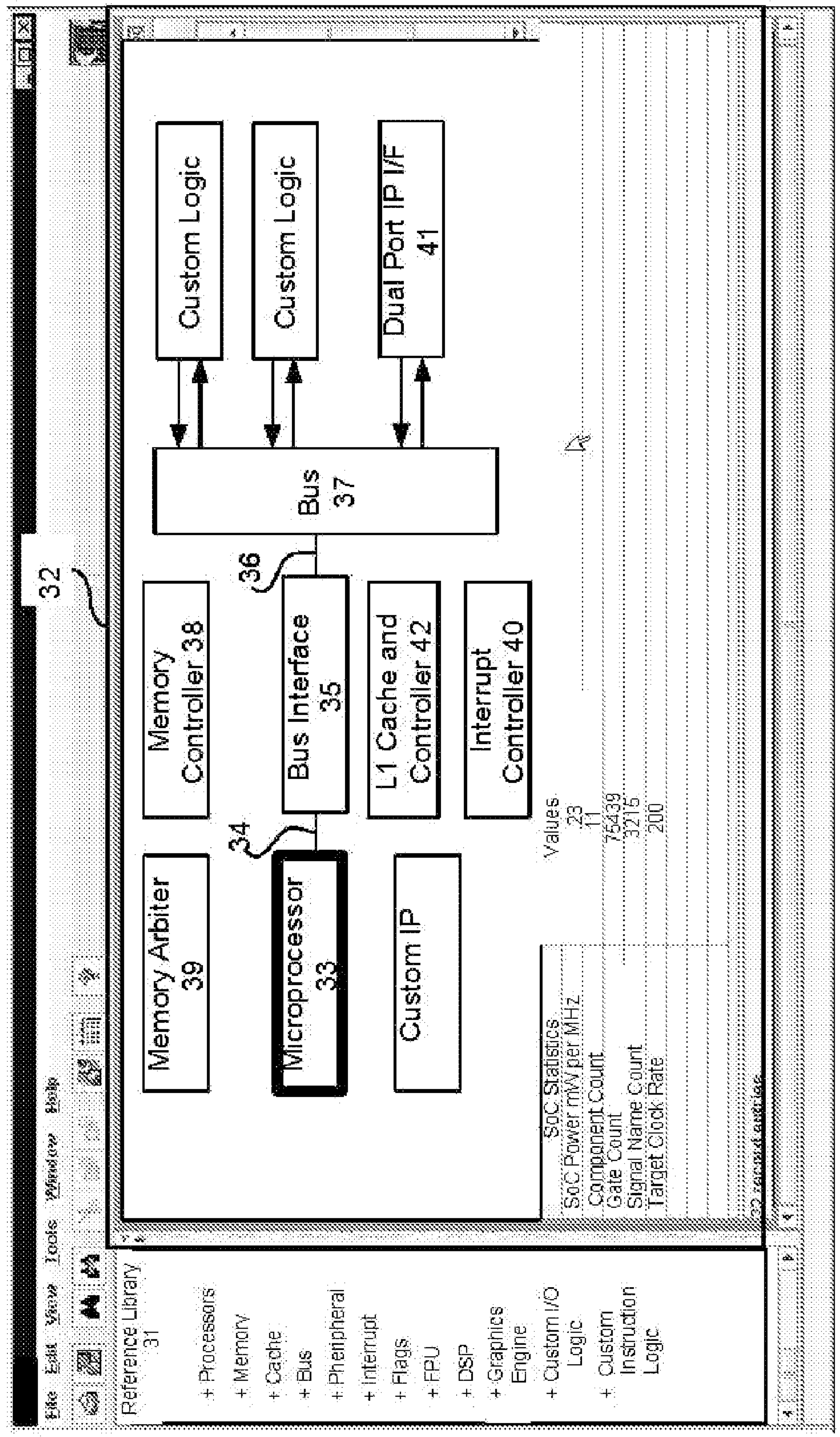
FIG. 3 is a block diagram illustrating a graphical user interface for an embodiment of the mechanism of FIG. 2 in accordance with an embodiment of the present invention.

FIG. 3 illustrates a graphical user interface (GUI) associated with module 21 of the computer program 15. The GUI of module 21 provides a reference area 31 and a work palette 32. When executed, module 21 ultimately provides an HDL description of the selected components and deposits it in the description file. Components are identified in the reference area 31 and when selected are instantiated in the work palette 32.

Components in reference area 31 may include processors, multiple processor cores, memory sub-systems, bus sub-systems, I/O interfaces, and custom logic by way of example. Indeed it is not unusual for a SoC design to include a processor, a co-processor, video processor, digital signal processing processor or a graphics processor coupled to other components such as memory, memory controllers, caches, a DSP, bus structures (such as a crossbar switch, hierarchical bus structures, networks on chip (NoCs) or direct point-to-point communications), bus controllers and I/O bridges all of which are obtained from the reference area 31 of the GUI. Advantageously, reference area 31 may provide the designer of a SoC with a plurality of configurable or configured processor cores so that the designer can implement a wide range of functions ranging from conventional DSP functions to media-processing functions while employing a consistent set of development tools.

More specifically, reference area 31 comprises a hierarchical index of various components. Components in reference area 31 are displayed preferably in text format but it is possible to optionally display the components in a graphical format. Component may be selected in reference area 31 and dragged into the work palette 32 using a computer mouse or other input selection device in a manner that is well known in the art.

Module 21 further includes a rules engine for determining configurable parameters that the designer or computer program may select. In one embodiment, the rules engine uses a database of descriptive elements that can be selectively incorporated into an RTL description of the component. In other embodiments, the rules engine may access a flat description file that includes one or more parameters that can be selectively customized by either inputting data or by selecting one of a plurality of options for each component. In other embodiments, the description of customizable parameters are described in a relational database with each description of the component incorporating various combinations of the configurable options. Preferably, the description defining each component is in synthesizable RTL such that computer program 15 can synthesize, functionally verify and automatically produce a hardened GDSII description of the integrated circuit before the circuit description is sent to a selected foundry.

Once instantiated in the work palette 32, each component is preferably displayed as a graphical icon. Interconnections between components or a bus structure are similarly added to the view shown in work palette 32. To facilitate the modular design methodology of the computer program 15, each component is displayed as a black box with interconnect stubs available for the designer to grab and graphically drag to connect to other components in the work palette 32. In one embodiment, the computer program 15 suggests a logical interconnection between the components, which the designer can then either approve or reject.

To illustrate the interconnection process, consider a processor component 33, shown in work palette 32, with a graphically extended interconnect stub 34 that couples microprocessor component 33 to a bus interface unit 35. Likewise, bus interface unit 35 has a graphically extended interconnect stub 36 that couples the bus interface unit to bus 37. If the designer desires different connectivity, the proposed interconnects can be rejected and manually instantiated.

Continuing with the illustration, memory controller 38, memory arbiter 39, interrupt controller 40, dual port interface 41 and L1 cache 42 have been instantiated in work palette 32 but the respective interconnection stubs are not yet connected to bus 35.

Note that reference area 31 includes a plurality of repositories each of which comprises a plurality of related components. For example, processor 33 is selected from the processor repository while the bus interface unit 35 and bus 37 are selected from the bus logic repository. More specifically, each repository includes a plurality of components that are each represented as an icon but which are treated by computer program 15 as a unique IP block. Within each repository, a number of different variations of a component type are visually presented to the designer in the form of either text or an icon. For example, memory controller 34 may be a memory-management unit (MMU) (not shown), logic that implements a translation lookaside buffer (TLB) (not shown) or a fixed mapping translation (FMT) for applications that do not require address mapping or protection. Memory icons may include any suitable storage medium for storing program instructions and/or data to be processed by processor 33, including but not limited to dynamic random access memory (DRAM), static random access memory (SRAM), synchronous DRAM (SDRAM), double-data rate SDRAM (DDR-SDRAM), Rambus DRAM (RDRAM), read-only memory (ROM), programmable read-only memory (EEPROM), FLASH memory, magnetoresistive random access memory (MRAM) and the like, or any combination thereof. One skilled in the art will appreciate that other repositories can be defined and components can be readily added to or subtracted from each of the repositories.

Further, once a component is selected, the designer may, if desired, also input related attributes when a selected component also requires the selection of hardware attributes. In one embodiment, the designer is prompted to select an appropriate value for the attribute from a popup menu. For example, if the desired size of L1 cache 42 is 8K, the cache size may be selected from the popup menu (not shown). In one embodiment, the popup menu is selected by highlighting the cache icon by positioning an input device such as a mouse controlled pointer (in a manner that is well known in the art) over the icon. The selected attribute is then associated with the cache in the description file. Instead of selecting a value, the designer can select an "optimize value" essentially reserving the attribute value to be determined at a later point in the design process or determined automatically via analysis of the workload by selecting the optimization function.

Similarly, a second menu, if necessary, enables selection of the cache line size. Other attributes such as the number of caches on the chip (e.g., the designer can specify whether each processor in a multiple processor core implementation will include a separate cache or whether a common cache will be shared by all processors), the depth (i.e., the designer can specify if there will be one, two, or three cache levels) and size of each cache (for example, a L1 cache can be specified as an 8K cache, a L2 cache can be specified as a 16K cache and a L3 cache can be specified as a 64K cache). Alternatively, the designer can request that the attribute be optimized based on the storage requirements of the application and operating system code as determined by modules 23 and 24 or operating characteristics as determined by module 22.

Once a component is at least partially instantiated in the work palette 32, a corresponding HDL description script is obtained from repository 18 and added to the description file. In this manner, module 21 builds the HDL file for simulation and synthesis in real time as the designer selects and places components in the work palette 32. Then, once the designer specifies the attributes and interconnects, the related HDL scripts in the description file are saved to persistent storage for subsequent synthesis.

It is to be understood that each module 22-25 comprises a GUI, however, such GUIs are not individually illustrated herein because the design of such are typically application dependent. Note, however, an embodiment of the present invention may include an additional top level GUI (not illustrated) that provides a menu for a designer to select one of the modules 21-25 or to enter into one of a plurality of electronic agreements for the design, simulation, verification and, optionally, the manufacture of an integrated circuit. These agreements may differ in terms of contractual obligations, access to confidential information or access to modules 21-15.

In one embodiment, the GUI is implemented as an Asynchronous JavaScript and XML, or AJAX, based web page. AJAX is a web development technique for creating interactive web applications that makes web pages more responsive by exchanging small amounts of data with the server such that the entire web page does not have to be reloaded each time the designer requests a change. This increases the web page's interactivity, speed, and usability by avoiding page re-loads when presentation elements (drop-downs, labels, etc.) are changed in response to some other element changing or being selected. It will be appreciated that other remote scripting techniques may be employed to develop an interactive web page that can be hosted by a data center or web sever.

It will be appreciated that a typical design will require the display of voluminous amounts of data on the designer's browser. Further, it will be appreciated that web pages, unlike native applications, are loosely coupled (meaning that the displayed data is not tightly bound to data sources), the data must be first collected into an HTML page format before presentation on the designer's browser. Rather than reload the web page for each data modification made by the designer, the present invention uses the remote scripting language to bypass the requirement to make loosely coupled web page behave much like a tightly coupled application, but with a more variable lag time for the data to pass through a longer "wire" to the remote web browser.

In one embodiment, component specific information is not downloaded to the designer's browser until required by a local action at client computer 12, in which case the GUI would fetch the necessary additional data to populate the web page without requiring the entire web page to be re-loaded. Advantageously, HTML is generated locally within the browser JavaScript calls and the actual data are downloaded only when needed. This feature means that Ajax web pages on the designer's browser can appear to load relatively quickly since the payload is relatively small. In addition to "load on demand" of components, the present application may, in some embodiments, load stubs of event handlers and then load the functions on the fly to reduce bandwidth consumption for complex functionality.

The present invention separates the delivered design specific content, which is embedded in XML from a database in persistent storage 19 (see FIG. 1). The structure of the browser webpage is preferably built in HTML or XHTML, by way of example, and is then reflected and made available to dynamic manipulation in a document object module. The style elements of the webpage—everything from fonts to picture placement—are derived by reference to embedded or referenced CSS, which refers to cascading style sheets—a stylesheet language. Web page functionality is provided by a combination of Javascript on the client browser, standard HTTP and XMLHttp for client-to-server communication, and server-side scripting and/or programs utilizing any suitable language to receive the designer's specific requests and respond appropriately.

Figure 4:
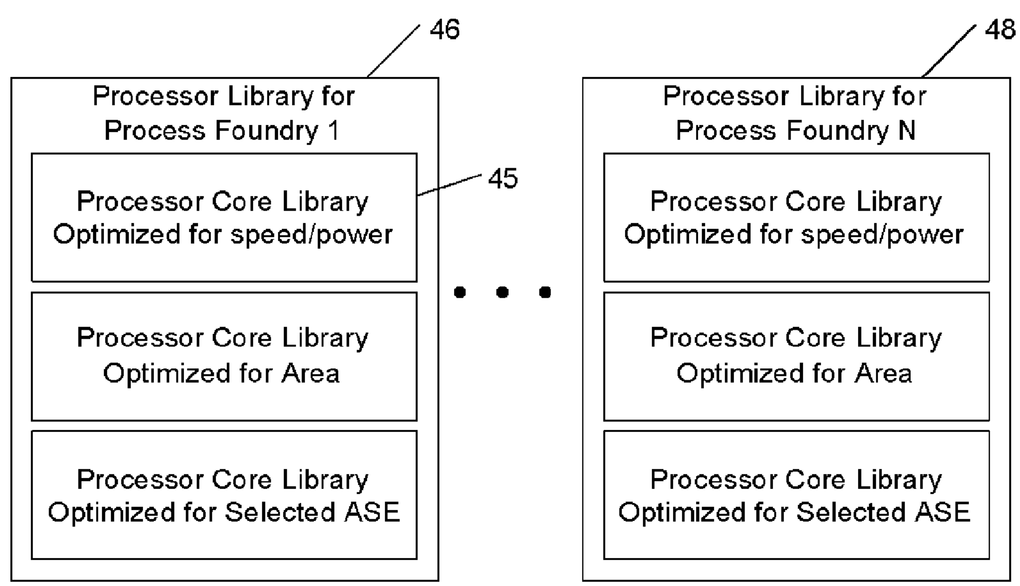
FIG. 4 illustrates a graphical user interface and database structure for an embodiment of the mechanism of FIG. 2 in accordance with an embodiment of the present invention.

As illustrated in FIG. 4, selected performance characteristics, provided from module 22, are compared to a matrix of performance specifications associated with each component in a repository. In one embodiment, the description of the performance specifications for each component comprises a plurality of entries in a relational database that includes a basic RTL description of the component linked to other files that describe selectively customizable parameters for a particular process technology (e.g. 130 nm, 90 nm or 65 nm) and foundry.

Based on the specified characteristics, one or more components may be excluded from the list of components that are useable in a particular design. By way of illustration, the designer initially selects desired performance characteristics for a processor core in table 45 as indicated by the X's in table 45. In this example, the designer has requested that the processor core operate at greater than 70 MHz, have a core size of not more than 2 $mm^2$ and have a power consumption of less than 0.225 mW/MHz at 1.2 volts. Alternatively, the designer could simply indicate that the processor be optimized by selecting the optimize column for one or more of the parameters.

Module 22 compares the selected characteristics to the characteristics of each processor component in the repository. Within the repository, the technical specifications for each processor component is described in one of n tables 46-48, it being understood that n may be any number corresponding to the number of optimized components available in a particular repository. In one embodiment, tables 46-48 preferably comprise an object-oriented programming database where each component is defined as an object that is a member of a component class (for example, a processor class) and each version or variation of a particular component is an individual instance that is defined by a subclass that is a more specialized description of the processor class. Each component if further defined in terms of identified foundry design rules. Other embodiments may utilize a relational or multidimensional database optimized for online analytical processing (OLAP) applications.

Referring again to FIG. 2, when the designer selects the optimize parameter, the optimal component is graphically presented to the designer to enable the final selection of the most appropriate core. Advantageously, if the optimized design requires at least a single processor core, the designer may ignore the recommended processor core and explicitly select a processor core from the processor repository that meets the perceived performance requirement for the design. For example, the designer may select a multi-threaded processor core or multiple processor cores, some of all of which may be multi-threaded. Later in the design cycle, this selection can be changed as the performance requirements are subsequently refined. Alternatively, the designer can instruct module 22 to implement a 'best-match' processor core from the list of available cores. Regardless of how selected, the selected processor core and its attributes are then associated with the graphically illustrated processor 33 (see FIG. 3) in the description file.

While the hardware components are an important part of a SoC, they must operate in conjunction with application software and operating system software. In many embedded applications, the application software targets specific tasks that are to be performed in an efficient manner. Thus, it is often desired to identify instructions that, when executed by processor 33, achieve the intended results quickly and efficiently. Accordingly, module 23 performs a dynamic analysis of the workload to identify instructions and to select appropriate application specific instruction extensions. Preferably, module 23 provides quantitative information on the application software including code structure, critical components, risk areas etc. Based on the analysis, module 23 recommends the addition of certain application specific instruction set modifications or the designer may specify a defined user instruction.

In one embodiment, module 23 may include one or more IP blocks of the processor core architecture to provide additional instructions targeted to a specific task. For example, one logic block may provide a set of instructions directed to handling graphics oriented tasks while another logic block may provide a set of digital signal processing instructions. In other embodiments, the logic block may provide branch predictor choice/inclusion, cache size customization, addition of cache levels, pipeline design (superscalar width, instruction window size, etc.), additional processing components and the like.

To illustrate, if the application demands real-time processing of video or audio packets, the processor core 33 selected by the designer may include specific instructions directed towards the digital signal processing (DSP) application. If the application requires rapid processing of packets, the optimal configuration may be a minimally configured processor without a dedicated DSP IP block instantiated into the design. If the DSP IP block is added to the design, RTL code for the application specific instruction set modifications are added to the description file. With the selection of the dedicated DSP, it is quite possible that the processor performance characteristics can be minimized resulting in significant savings in power and die area so a lower performance processor may be instantiated in place of the initially selected processor 33.

In general, as the designer makes additional performance selections, the description file is updated with the RTL code to reflect the designer's designation. Clearly, given the large number of possible applications for a SoC, the specific instruction set modifications can be numerous and are typically dependent on the specific application. Accordingly, further discussion of application specific instruction set modifications are not otherwise discussed.

Certain applications may require the designer to design a unique IP block for integration with processor 33 or instantiated in the SoC as a coprocessor to handle a specific task. Accordingly, the present invention provides a mechanism for the designer to create a repository that includes IP logic that defines implementation specific instructions. The IP logic may also be provided by one or more third party vendors or by the designer who desires to implement a previously developed logic block in the new design. Verilog or other HDL language can be used to implement these IP blocks so that existing development tools can support the design process.

Figure 5:
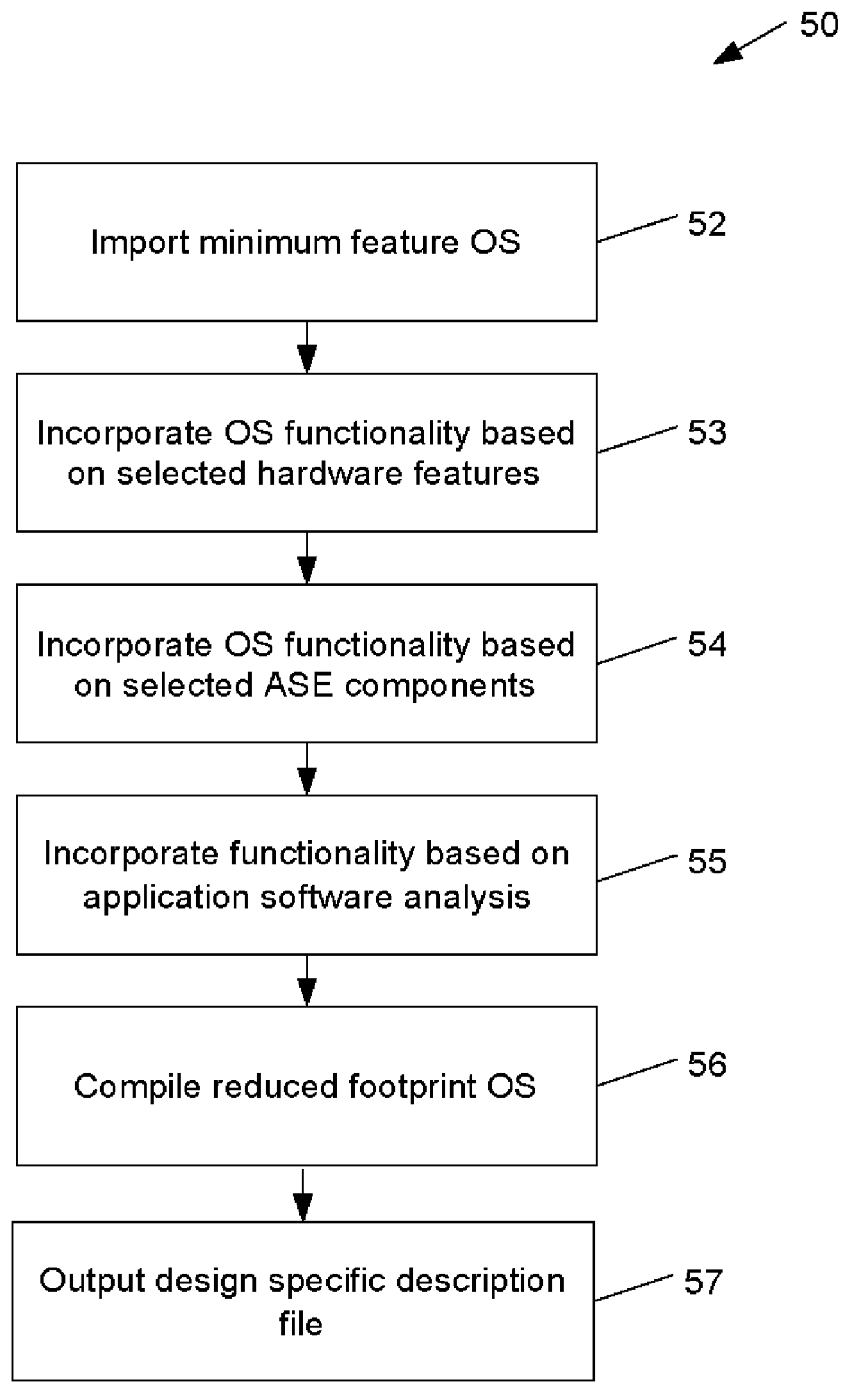
FIG. 5 is a flow diagram illustrating one specific embodiment for configuring the operating system in association with the mechanism of FIG. 2 in accordance with an embodiment of the present invention.

Refer now to FIG. 5, which illustrates module 24 of computer program 15 in more detail. Once the software and hardware attributes of the design are established, it is possible to determine the optimal operating system footprint. This module is used to minimize the footprint of the operating system and middleware if any, that will typically be stored in non-volatile memory on the device or in an off-chip persistent storage device. Module 24 interfaces with modules 23 and 22 to determine whether it is preferable to implement certain functions in software rather than hardware. For example, in one embedded application, the application software may perform significant number of floating point multiplication operations so a hardware multiplication is the preferred implementation thereby minimizing the need for the operating system to include a floating point multiplication algorithm. In another embedded application where the application software seldom performs the multiplication operation, it is area and power efficient to implement the multiplication operation in software rather than in hardware even if it will take significantly longer to perform the multiplication when the need arises.

Module 24 enables the configuration of the operating system to minimize its footprint in memory in the finished product. Specifically as indicated at 52, a minimum feature operating system is initially provided. The operating system may be, for example, Windows CE available from Microsoft Corporation, Linux or a real time operating system (RTOS). In one embodiment, the entire operating system may be ported to the device but importing a full blown operating system will result in inefficient use of memory resources because unused features will be unnecessarily included. However, with module 24, it is possible to configure the operating system based on a prototype description. In a preferred embodiment, a prototype or baseline operating system is provided together with options that the designer can configure to support the operating of the hardware components.

As indicated at 53, module 24 configures the operating system to match the compiled features of the operating system with the instantiated hardware components. For example, if the design comprises a simple processor that does not require paging to manage virtual memory such that the design does not include a translation look aside buffer (TLB) based memory management unit, then the operating system module will not include a TLB management module. If the system does not include a cache, then there is no need to bring in a cache management module. Specifically, as the designer selects each hardware feature in module 21, module 24 updates the operating system configuration to incorporate corresponding operating system modules that support the selected feature. During the operating system build, these support features will be retained and linked to pertinent components while other operating system options are not selected.

As indicated at 54, module 24 will also incorporate corresponding operating system modules that support the functional features of the added IP blocks in the operating system build. Thus, depending on the selected hardware functionality, module 24 configures the operating system to support application specific functions by incorporating only selected drivers.

As indicated at 55, module 24 selects operating functionality based on the workload analysis performed by module 23. This feature enables the operating system to support any identified peripherals or services while building the operating system kernel. Clearly, there are aspects of the operating system things that can be configured, however, module 24 links the operating system configuration to the design of the integrated circuit and the application software.

By way of illustration, consider a design process for building a cell phone where a minimum operating system footprint is desirable due to the limited memory that is available on this SoC design. As will be appreciated by one of skill in the art, cell phones do not have the luxury of having megabytes of memory available to store never used operating system services. Accordingly, module 24 configures the operating system at build time so that only the services that need to be present are built into the operating system.

In one embodiment, module 24 outputs C or C++ code that configures the Windows, Linux or RTOS operating system by outputting header files, switches, and a modified makefile. Advantageously, the hardware and the operating system do not need to be configured at the same time, but they may be configured in parallel or in a sequential manner. Advantageously, module 24 may make certain tradeoffs in order to optimize one or more functions in conjunction with modules 21 and 22. By way of illustration, the designer can provide module 24 with a range of possibilities such as 1 megabyte of memory, restrict the processor to be no bigger than 3 $mm^2$ while meeting certain performance metrics. Module 24 then determines the optimal configuration for the design by selecting the processor that most closely matches the specified parameters and providing any additional functionality in software either at the application, middleware or operating system level.

To illustrate the optimization process, consider the process of multiplying two numbers. In one design, the processor can include a high performance hardware multiply unit. In another embodiment, the design may simply bring in a floating point emulation repository that the user could explicitly access by selecting a floating point unit or not. In yet another embodiment, the designer may simply specify performance (rate of megaflop), or go a step farther and give computer program 15 an application to profile and to select the optimal configuration.

Continuing with the floating point example, if the application has only a number of floating point operations, modules 23 and 24 can determine that the application only needs 0.1 mflop and that the floating point repository will fit within the available memory. Accordingly, the use of the emulation repository is an acceptable solution for that particular application and module 24 would include the floating point emulation repository in the operating system build. Alternatively, if the application includes a large number of floating point operations, then module 21 will over-ride the selection of the emulation repository and instantiate floating point hardware in which case the emulation repository is omitted from the operating system build resulting in a smaller footprint for the operating system. With computer program 15, the selection process may be automatic or the designer may be guided through the selection process through prompts displayed by computer program 15.

In another application, if the processor is configured to include media processing or DSP extension instructions for certain media applications, the operating system abstraction layer will not know whether there is MMX hardware or emulation. Accordingly, there are two possibilities that module 24 needs to abstract out such that the media player application doesn't need to know whether the operating system is optimized for instantiated MMX hardware, or the configuration of the hardware extension such as a 4 way or an 8 way parallel unit. Module 24 is responsible for bringing in the optimized driver for the instantiated hardware components. If the hardware component is not instantiated in silicon or RTL, then module 24 will optimize the application software for emulation given the hardware that does exist in the design.

Consider yet another application where a dual core SoC is provided. In such a design, module 24 would compile a symmetric multiprocessing operating system that would support, by way of example, PCI Express, DDR2, bus width, description of on-chip buses, whether it is compatible with the Open Core Protocol, cache sizes and many features that can be configured in a typical SoC design.

As indicated at 56, the optimized operating system is compiled into a reduced footprint operating system that is instantiated in the device, preferably in a non-volatile computer readable storage medium.

Advantageously, module 24 enables porting of high level application source code to a new platform that is customized to provide the resources required by the source code. This feature enables code to be ported to a new platform without having to rewrite the code to make it compatible with the hardware platform while at the same time enabling the SoC designer to take advantage of new process or component technology.

Figure 6:
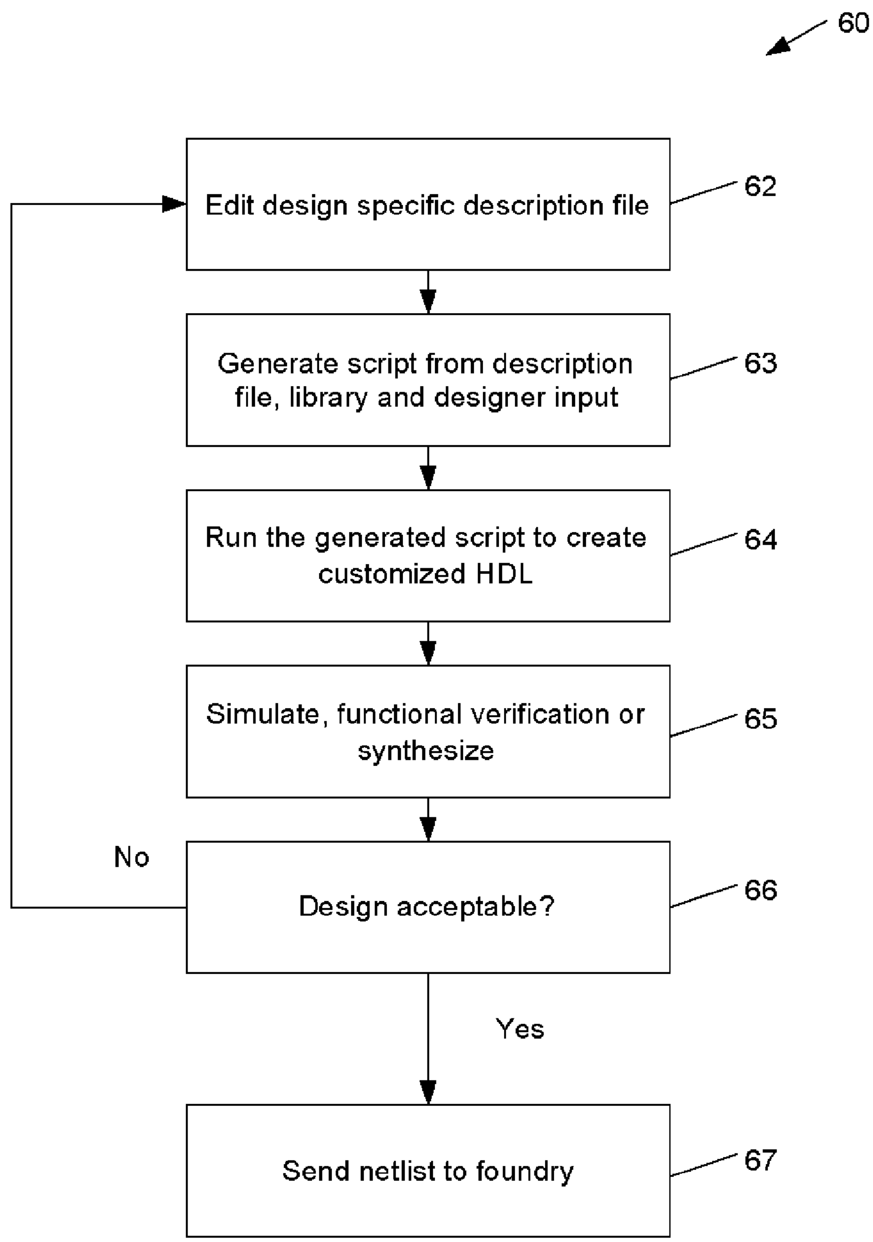
FIG. 6 is a flow diagram illustrating one specific embodiment of the generalized mechanism of FIG. 2 in accordance with an embodiment of the present invention.

Referring now to FIG. 6, one embodiment of a generalized method of the invention is described. This description is presented in terms of an algorithm or computer program running on a server that allows the designer to remotely access the computer program over the internet or other network using a thin client or other similar processing device. Additionally, one or more portions of computer program 15 may be embodied in hardware or firmware as opposed to software if desired, such alternate embodiments being well within the skill of the computer artisan.

Initially, a description file specific to a particular design is edited at 62 where the designer selects desired modules or functions for the design. In one embodiment, analysis of the workload is used to automatically generate a description file. Instructions relating to the design are added to or subtracted from the description file, or generated as necessary. For example, in signal processing applications, it is often advantageous for processors to include a single "multiply and accumulate" (MAC) instruction. This instruction commonly improves system performance and reduces the amount of computer code required to perform signal processing tasks; two desirable characteristics in such systems. Conversely, applications that are essentially logical control oriented in nature have little or no need for such an instruction. Eliminating the instruction from the processor reduces the processor die size and gate count, also a generally preferred advantage. In still another case, the designer may implement an instruction that is only of value to one specific application. In all of these examples, the present invention permits designers a greater degree of control over the processor design and more flexibility in making design tradeoffs and optimizations.

It should also be recognized that when using the computer program 15 of the present embodiment in its most common mode, the hierarchy of design is determined by a repository of scripts.

As indicated at 63 of the method shown in FIG. 6, a repository location for each component is defined. The technology repository files in the present invention store all of the information related to cells necessary for the synthesis process, including for example logical function, input/output timing, and any associated constraints. In the present invention, each designer can define his/her own repository name and location(s), thereby adding further flexibility. A makefile is then generated using the description file information, repository information previously described, as well as additional designer input information relating to the desired configuration and attributes of the device. For example, in the computer program 15, the designer is asked to input the type of "build" (e.g., overall device or system configuration), width of the external memory system data bus, different types of extensions, cache type/size, etc., as described in additional detail below with respect to FIG. 7. It will be recognized that such input may be in the form of an interactive software prompt, or alternatively may occur using command line parameters, by accessing a pre-built configuration file, or a concurrently running application or other computer program 15 resident on the designer's system or another system linked thereto. Many other methods of input are also possible, all of which are considered to be within the scope of the invention.

Next, the makefile is run at 65 to create a customized VHDL or Verilog model. As part of this step, the designer is presented with a variety of optional response menus and prompts to further define the model based on design attributes.

The designer may select whether to synthesize or simulate the design at 65. If simulation is selected, a separate script is run to generate a separate simulation makefile for use in the simulation. Simulation scripts and makefiles are generally well known to those of ordinary skill in the art, and accordingly will not be discussed further herein.

Alternatively, if synthesis is selected, the synthesis script(s) are run to generate corresponding synthesis makefiles. After completion of the synthesis/simulation scripts, the adequacy of the design is evaluated at 66. For example, a synthesis engine may create a specific physical layout of the design that meets the performance criteria of the overall design process yet does not meet the die size requirements. The designer may make changes to the control files, repositories, or other elements that can affect the die size. The resulting set of design information is then used to re-run the synthesis script. Process 60 is preferably initiated by the designer from a thin client while the computing aspects of process 60 are performed on a server. In this manner, the design repositories and synthesizable files are maintained in a secure environment. Preferably, only a hardened design is exported to a foundry at the conclusion of the design process as indicated at 67.

Note that there are many different criteria that may be used to determine whether or not a design is acceptable. In general, each design will have a different set of criteria used to determine the acceptability of the final design. Die size, power consumption, clock speed, and numerous other factors may constitute alone or collectively design constraints or targets. This great variability in acceptance criteria is one factor that demands the flexibility of the present invention.

If the generated design is acceptable, the design process is completed. If the design is not acceptable, the process steps beginning with step 62 are re-performed until an acceptable design is achieved. In this fashion, the method 60 is iterative. Note that if the simulation path is chosen in order to simulate the operation of the generated design, the designer may subsequently run the synthesis scripts, if desired, to synthesize the logical design into a physical structure.

Figure 7:
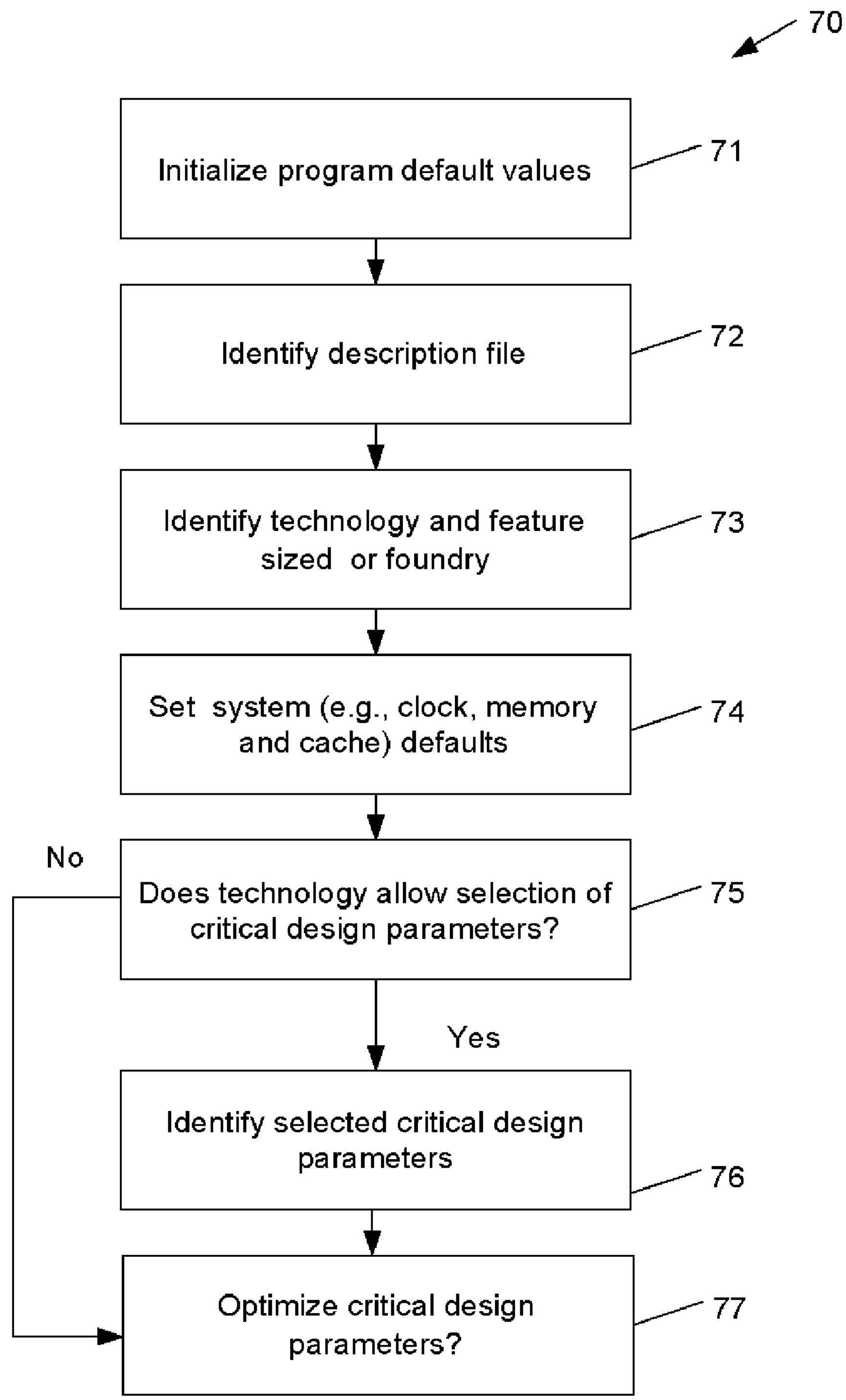
FIG. 7 is a flow diagram illustrating one specific embodiment of the generalized mechanism of FIG. 2 in accordance with an embodiment of the present invention.

Referring now to FIG. 7, one embodiment of the architecture functionality of computer program 15 is described in detail. Computer program 15 essentially gathers information about the designer's system, including for example, specifications from the designer's repositories, and assembles this information for later use by other modules within the program. The output of computer program 15 is an HDL synthesizable model of the design.

As shown in FIG. 7, process 70 comprises a series of steps, the first of which is initializing the program and setting default values at step 71. Next, a storage location is identified at 72 for the description file and HDL (in this case Verilog) files to be generated in subsequent steps. In step 73, the technology/feature size or selected foundry is obtained from the designer (or another source, as previously described). For example, the designer may desire a 0.130 micron process or a selected foundry manufacturer for their design.

In step 74, the system clock, memory configuration, and cache default values are set based on the technology chosen at 73 above. If the technology chosen by the designer allows a choice of clock speed, the designer is prompted (or the selection otherwise obtained) as indicated at 75 and 76. Alternatively, the designer may select the optimize option and allow computer program 15 to select the optimum clock speed. The clock period is then set at 77.

Figure 8:
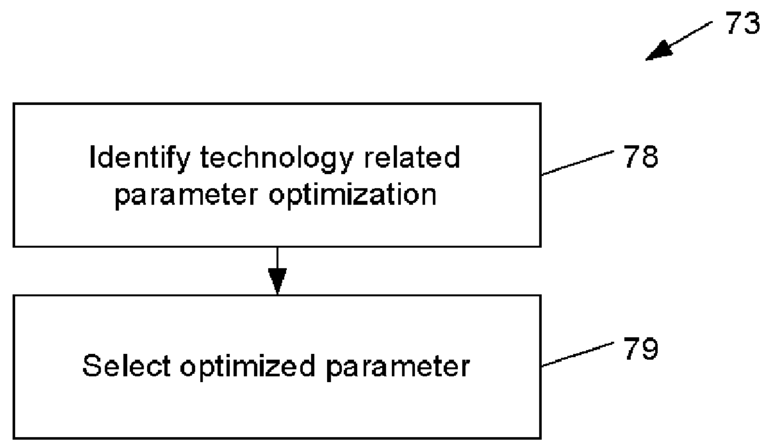
FIG. 8 is a flow diagram illustrating one specific embodiment of the generalized mechanism of FIG. 2 in accordance with an embodiment of the present invention.

Referring now to FIG. 8, process 73 continues with steps 78 and 79, wherein the clock skew is selected (or otherwise defaulted) and other parameter optimization is input specific to a selected foundry's design rules. If the design includes any application specific extensions, extension logic script is then obtained. As used herein, the term "extensions"refers to a set of predetermined logical functions. For example, extensions within the system may include rotate, arithmetic and logical shifts within the barrel shifter, small multi-cycle multiply, MAC function, swap function (for swapping upper and lower bytes), timer interrupt, and the like. Lastly, at 79, the need or designer desire for a memory subsystem such as a scratchpad RAM is analyzed (based on the designer's technology choice), and the memory subsystem values are set accordingly.

Figure 9:
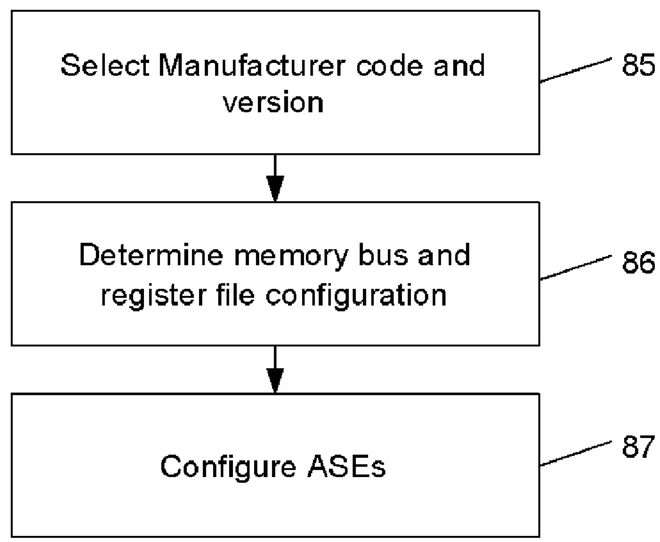
FIG. 9 is a flow diagram illustrating one specific embodiment of the generalized mechanism of FIG. 2 in accordance with an embodiment of the present invention.

Referring now to FIG. 9, the method 73 continues with step 85, wherein the designer's manufacturer code (specific to each designer entity) and version are obtained from the designer. In step 86, the memory bus and register file configuration required for the design are determined. Next, as indicated at 87, the system configures the extensions in view of the choice of technology.

Figure 10:
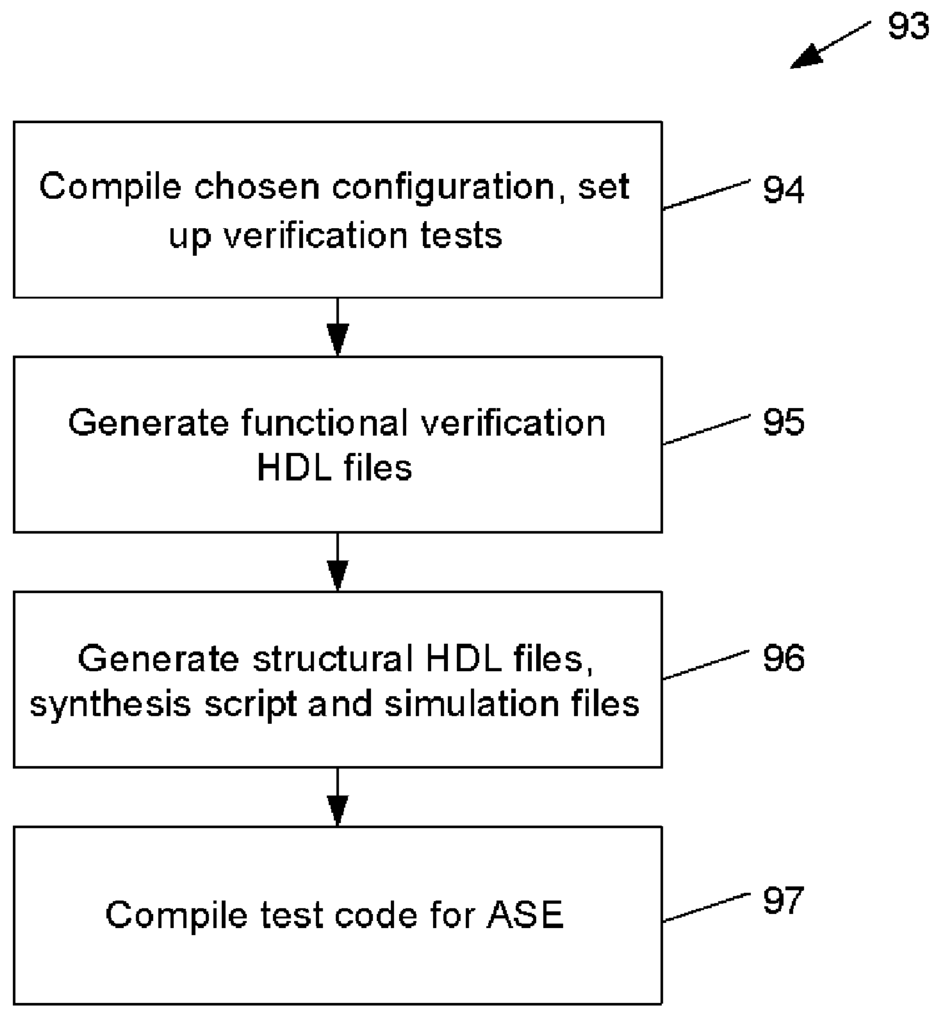
FIG. 10 is a flow diagram illustrating one specific embodiment of the generalized mechanism of FIG. 2 in accordance with an embodiment of the present invention.

Referring now to FIG. 10, the configuration is compiled in process 93, the core configuration registers and configuration register test code are set up as indicated at 94. Next, at 95, the functional HDL files are generated from the description file that includes the baseline RTL files as modified with any chosen or calculated values and merged with any other HDL files where required. Note that in the illustrated embodiment, only the prototype files actually required for the selected configuration are copied. At 96, the structural HDL files are generated, along with the synthesis scripts and simulation makefiles. Lastly, the test code required by the chosen extensions is compiled at 97.

Figure 11:
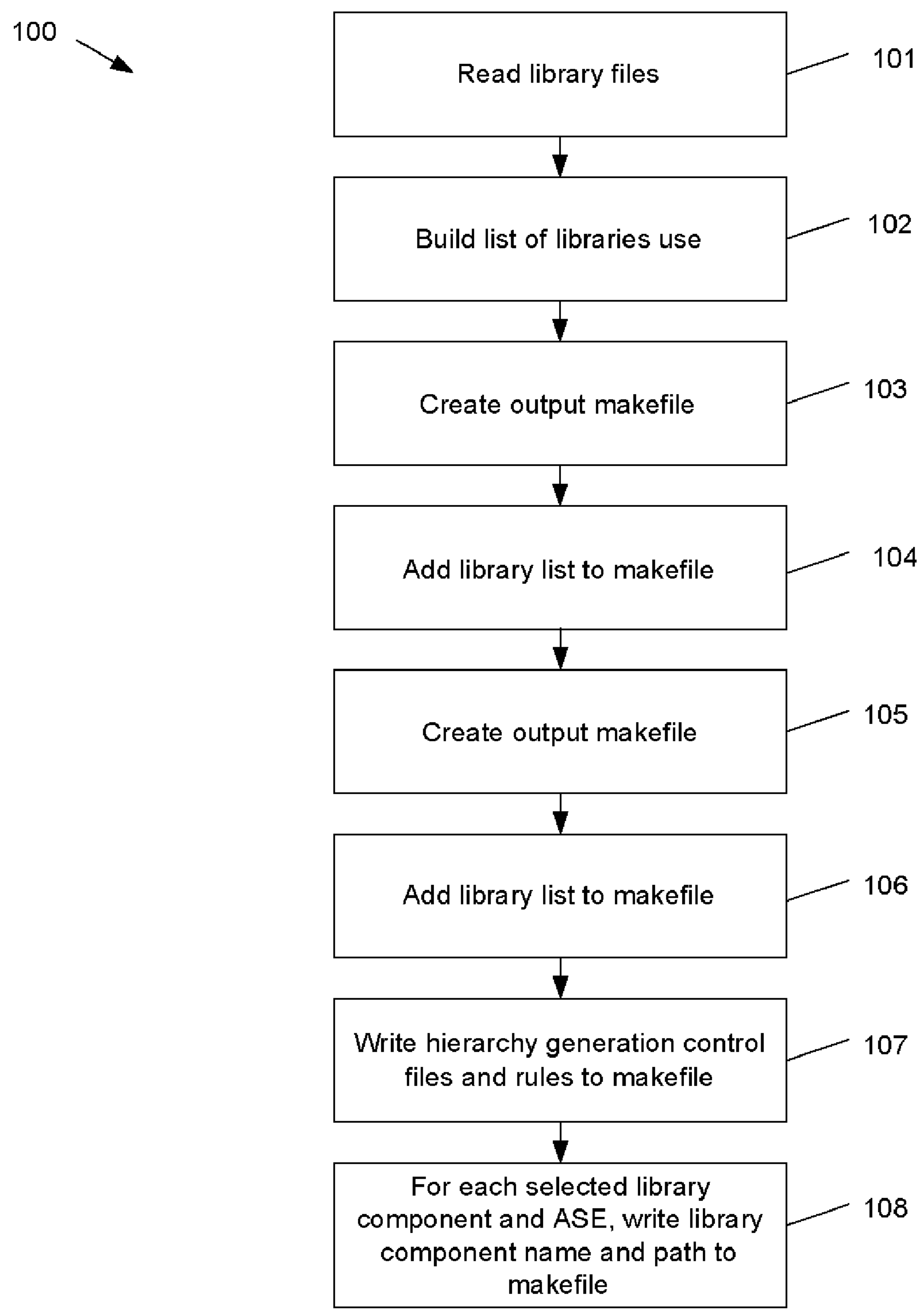
FIG. 11 is a flow diagram illustrating one specific embodiment of the generalized mechanism of FIG. 2 in accordance with an embodiment of the present invention.

FIG. 11 illustrates one exemplary embodiment of method 100 of generating a new script according to the invention. First, the applicable library file is read at 101. At 102, a list of the libraries used in conjunction with the design is built. After the library list is built, an output makefile is created at 103, and the constant headers written to the created makefile. At 104, the aforementioned library list is added to the makefile. Next, the "top-level" rule is added to the makefile at 105. As used herein, the top-level rule relates to those rules specified by the hardware description language (such as VHDL or Verilog), although it will be appreciated that others rule bases may be used.

After inclusion of the top-level rules, the datafile dependency rules are added to the makefile at 106. Lastly, the physical hierarchy generation control file rule is added to the makefile to complete the latter as indicated at 107. In one exemplary embodiment of method 100 of adding the repositories list to the system "makefile" is shown. Specifically, method 100 comprises reading each repository component as indicated at 108 and writing the repository component name and path to the aforementioned makefile. The algorithm terminates when all of the required repository information has been added to the makefile.

Figure 12:
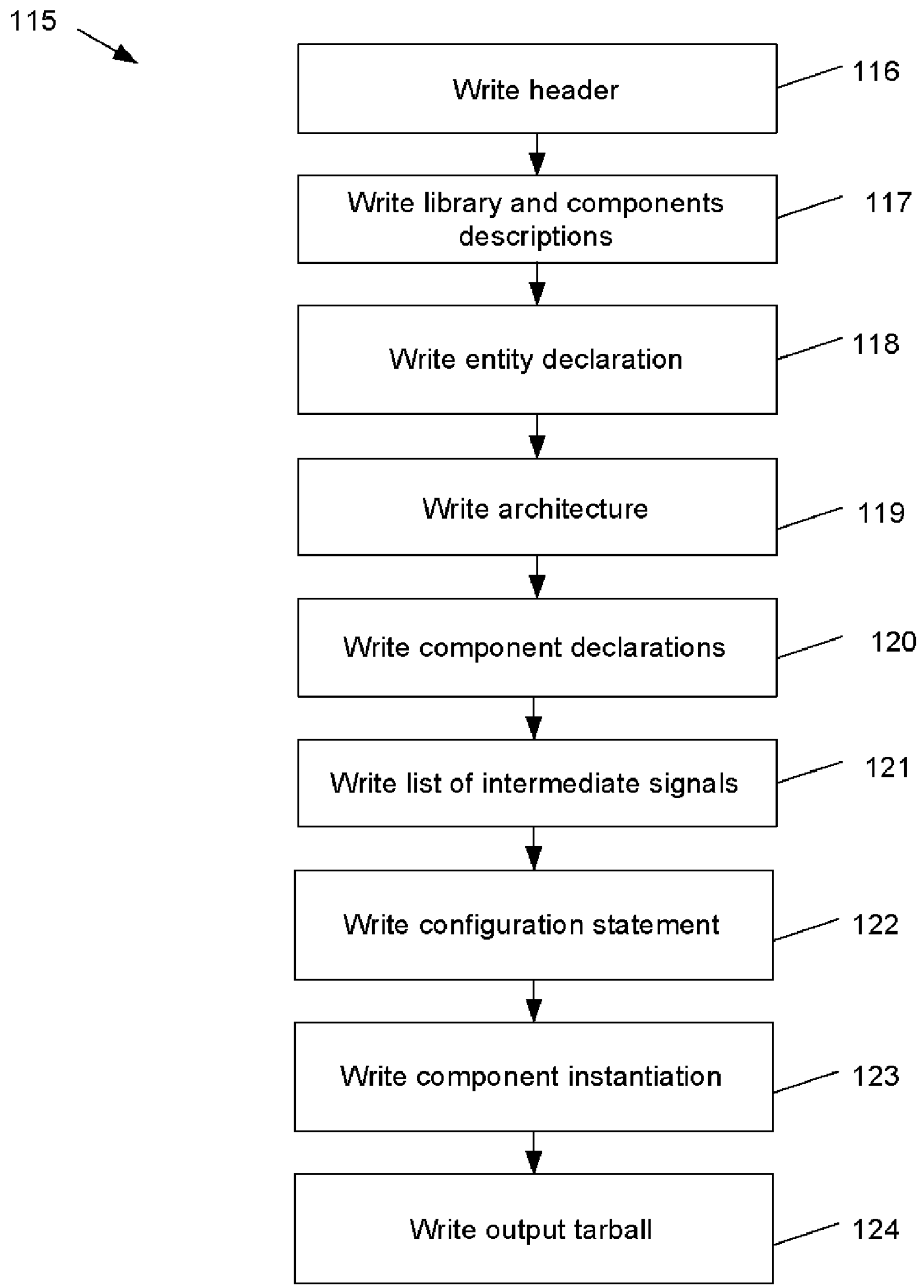
FIG. 12 is a flow diagram illustrating one specific embodiment of the generalized mechanism of FIG. 2 in accordance with an embodiment of the present invention.

Referring now to FIG. 12, one exemplary embodiment of a method 115 for writing one or more HDL files is described. The Verilog, VHDL or other HDL file is written in a sequence that conforms to the specification for appropriate format. It is noted that other HDL languages may employ differing formats that result in some information becoming unnecessary, or required in a different order. For the sake of brevity, the following description will only refer to VHDL. Initially as indicated at 116, the illustrated method 115 comprises writing the VHDL file header to a VHDL file. Next the list of repositories and packages used is written to the VHDL file at 117. Next the entity declarations are written to the VHDL file at 118. Subsequently the architecture information is written to the VHDL file at 119. Next, at 120, component declarations are written to the VHDL file. The list of intermediate signals is then written to the VHDL file at 121, and VHDL configuration statements are written to the VHDL file at 122. Then, at 123, all component instantiations are written to the VHDL file. Finally, output drives are written to the VHDL file at 124. This completes the hardware description language file generation process.

Advantageously, the server apparatus (see FIG. 1) for generating, simulating, and/or synthesizing a SoC design using the above described method allows the SoC designer to remotely interact with the program during the design, simulation, and/or synthesis processes.

Figure 13:
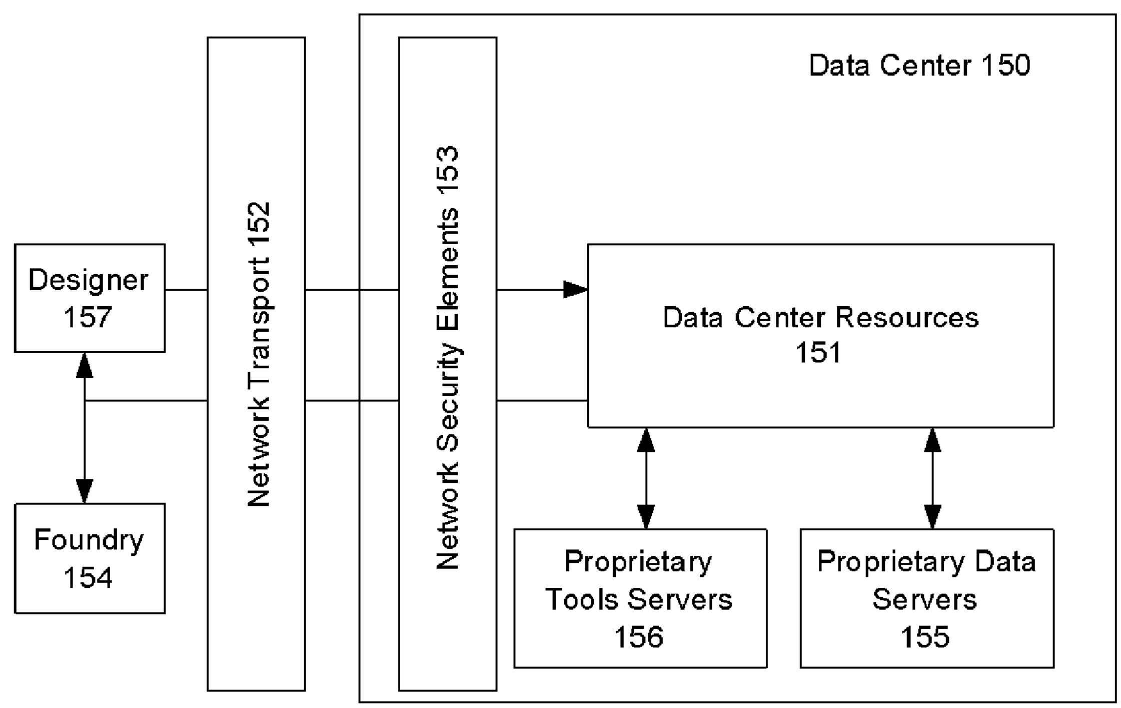
FIG. 13 illustrates a data center infrastructure required for supporting remote design of a SoC or a design in accordance with an embodiment of the present invention.

Refer now to FIG. 13 where a data center embodiment of the present invention is illustrated. As is well understood in the art, a typical data center 150 will include internal resources 151 comprising a plurality of servers some of which may be dedicated to specific tasks such as email servers, proxy servers, authentication servers, resource servers and storage devices for managing data structures and the libraries.

In addition data center 150 will include network transport devices 152 such as routers and switches that transport traffic between the servers within the data center and to the outside network. Designers access data center resources over the outside network. Redundancy is sometimes provided by getting the network connections from multiple vendors.

Data center 150 will also typically include network security elements 153 such as firewalls, VPN gateways, intrusion detection systems, load balancers and monitoring systems for the network and computer program 15. Typically, these security elements 152 will provide security and unauthorized intrusions form third parties via the network transport layer 152. It is to be understood that data center 150 may comprise a plurality of mirrored data centers that operate to minimize downtime and assure business continuance by distributing computer program 15 and component libraries. The multiple data centers may be operated in an active-active configuration, in an active-standby configuration or alternatively, in an active-active configuration with one or more standby data centers held in reserve to handle variations in work load balancing or disaster backup.

Preferably, data center 150 provides the computing resources such that a plurality of designers can simultaneously access design, synthesis and verification tools to generate a description of a SoC design using libraries of IP blocks (components) in a hardware description language that is synthesized using the aforementioned method of the present invention.

Once synthesized, the GDSII data is sent from data center 150 to a selected semiconductor foundry, as indicated at 154, that will fabricate the design for the designer 157. Advantageously, the designer does not need to explicitly contract with the foundry because the entire design process is automated by computer program 15. Further, it should be noted, that the designer does not require access to any of the "soft"synthesizable IP block because such information is securely maintained within data center 150. This feature is particularly important should the designer be located in a geographical region where export laws would not otherwise allow access to the RTL.

Alternatively, in other embodiments of the present invention, RTL for one or more IP blocks can be delivered to a remote designer if the contractual terms of the governing electronic agreement permits such access.

To minimize the risk that RTL components are collected and combined, the present invention selectively scrambles label names in the RTL code to make it difficult to decipher the relationship between various elements of the overall circuit description. The scrambling occurs on a case by case basis such that it becomes very burdensome to reverse engineer the RTL code. The correlation between the scrambled label names and the correct label names is maintained at data center 150 and linked with each designer. In other embodiments, the labels may be randomly changed prior to transmission of the RTL code to the client.

In other embodiments, RTL for one or more IP blocks are transferred from data center 150 to the designer so that they can perform synthesis and functional verification. Importantly, the RTL code includes a software lock that allows the designer to synthesize a limited number of configurations, such as, by way of example, three iterations. Once the maximum allowed number of configurations are synthesized, the designer must acquire a key to unlock the RTL code for additional development work.

Data servers 155 are populated by at least one but preferably a plurality of IP design vendors who migrate IP design block (components) to the data servers. Each IP design block provides for interoperability with other IP design blocks by adhering to an interoperability protocol that specifies process, timing and interface requirements for each block.

Servers 156 within data center 150 provide design tools, such as described above, to design, synthesize and verify each IC design. Preferably, the design tools are provided on server 152 by a plurality of tool vendors all of which are compliant with the interoperability protocol.

Data center 150 provides the development tools and methods so that designers can quickly access to implement a new SoC or IC design. The RTL code does not need to be distributed to each designer thereby protecting the IP blocks and extraordinary investment in developing the IP logic. Data center 150 protects this investment by preventing accidental disclosure or rogue use by a designer while at the same time greatly simplifies the process for developing a complex SoC or IC.

With the Internet-based design, simulation and manufacturing functions, designers can access proprietary IP blocks from a plurality of vendors, marry the IP with proprietary synthesis and verification tools and, once the design is approved for manufacture, initiate the manufacturing process. The present invention enables designers to increase their rate of innovation while minimizing the investment that would otherwise be required to acquire the RTL and the design and development tools.

In one exemplary embodiment of the present invention, the IC comprises a SoC comprising one or more RISC, CISC or other type of processors, memory, one or more bus structures and one or more controllers all instantiated on a single semiconductor device designed by a remotely located designer having access to the design tools executed by at least one server located in data center 150. The designer can select the foundry having process parameters that provide the optimal process specifications during the design process. Once the design is complete, a GDS2 data file is automatically sent to the foundry for manufacture.

Additionally, it will be noted that computer program 15 as previously described herein can readily be adapted to newer manufacturing technologies with a comparatively simple re-synthesis of the existing library of components instead of the lengthy and expensive process typically required to adapt such technologies using the "hard" or "soft" macro approach of the prior art systems.

One advantage of the present invention arises from the ability to provide designers the best of breed for each of the components that are necessary for building a complex SoC from a single design portal. To do this, the present invention further provides a mechanism for managing the licensing of the IP and for establishing the foundry relationship. These features are particularly advantageous for independent designers or for projects that are too speculative to justify the time and expense to independently design a SoC or circuit without use of third party IP.

In accordance with one business model for operating design center 150, each vendor that supplies one of the components listed in reference library 31 (see FIG. 3) also provides licensing terms for acceptance by the designer at the time the component is initially instantiated in work palette 32. Licensing terms may include warranty and pricing information.

The pricing information may specify the cost to instantiate the component in a design, if any, and the cost for each device that is subsequently manufactured by a contract foundry.

These licensing terms are provided as a manufacturer-specific addendum to a standard license template. Before granting access to computer program 15 (see FIG. 1) the designer is provided access to the license template for review and is required to agree to the terms of the license template before access is granted to the libraries and work palette. The terms of the license template set forth the minimum terms and conditions relating to use of the library components. These minimum terms may include pricing, export restrictions, warranties, maintenance upgrades, terms of use of the data center facilities, term of the license and other such terms and conditions that may be deemed necessary by the owner or operator of the data center. The designer accepts the license template by transmitting an electronic signature to the owner/operator or by selecting one or more electronic indicators that the designer has agreed to the license terms. Acceptance of the license template forms a binding contractual obligation.

For each component from a specific vendor that is instantiated, computer program includes the component in the manufacturer-specific addendum. If the designer only selects components from a single IP vendor, then there is only one manufacturer-specific addendum that is attached and incorporated into the license template. The addendum specifies each instantiated component as well as the pricing (one time and/or running royalty), warranties associated with the component, if any, and restrictions on use of the device or descriptions of the device (e.g., compliance with export laws and regulations).

Since the components may be configured for certain technology (e.g., 130 nm, 90 nm or 65 nm) and for a particular foundry, the manufacturer-specific addendum also includes foundry related terms and conditions. Such terms and conditions may include fabrication expenses, mask costs, and delivery terms for manufacturing and delivering prototypes and/or volume shipments of the IC.

The ability to provide components from a plurality of vendors is enhanced by requiring each IP vendor to verify that each component adheres to a common interface specification. In one embodiment, an interoperable modeling platform, such as SystemC, enables the development and exchange of very fast system-level C++ models and provides a stable platform for development of system-level code.

In one embodiment, the owner/operator of design center 150 specifies the interface specification which the IP vendors must adhere to before their IP for a component is added to the library. Preferably, each IP vendor has completed design verification testing using the suite of tools provided by module 25 (see FIG. 2). Thus, the designer can easily mix and match "best of breed" IP for a particular application.

Consider, for example, an embodiment where one vendor provides a memory controller that is particularly well suited for use with non-volatile memory in a single processor SoC while a second vendor provides a memory controller that is particularly well suited for use with non-volatile memory in a multiple processor environment. Accordingly, a designer may select the memory controller that is best suited to the particular application without having to worry that the selected memory controller may not be compatible with the selected processor core, bus, memory or operating system.

Further associated with each component listed in the reference library is a vendor source database file. When a designer instantiates a component, computer program 15 records the selection and provides the payment specified in the manufacturer-specific addendum to the IP vendor minus an agreed upon surcharge. Further, when the design is sent to the foundry, payment is concurrently made to the foundry minus an agreed upon surcharge. These surcharges are specified in an agreement between the owner/operator of the data center and the IP vendor or foundry. Such agreement may be entered into via electronic means or by other more traditional contractual instruments.

Similarly, access to a simulation, formal verification or layout program provided by a tools IP vendor can be provided as part of the license template or can be individually customized for a specific design as set forth in a manufacturer-specific addendum.

Payments from the designer are preferably made when the design process is initiated, when the design is sent to the foundry for the initial manufacturing order and each time devices are shipped by the foundry if a running royalty is provided by the terms of the license agreement between the designer and the owner/operator of the data center. In one embodiment, payment is made by credit card while in other embodiments, payments are made by initiating wire transfer from a bank account designated by the designer to a bank account designated by the owner or operator of the data center. In yet other embodiments, the owner or operator of the data center maintains a deposit account held by a trustee from which funds are deducted from time to time whenever certain specified milestones are achieved.

Although the present invention and its objects, features, and advantages have been described in detail, other embodiments are encompassed by the invention. In addition to implementations of the invention using hardware, the invention can be embodied in software disposed, for example, in a computer usable (e.g., readable) medium configured to store the software (i.e., a computer readable program code). The program code causes the enablement of the functions or fabrication, or both, of the invention disclosed herein. For example, this can be accomplished through the use of general programming languages (e.g., C, C++, etc.), hardware description languages (HDL) including Verilog HDL, VHDL, AHDL (Analog Hardware Description Language) and so on, or other programming and/or circuit (i.e., schematic) capture tools available in the art. The program code can be disposed in any known computer usable medium including semiconductor memory, magnetic disk, optical disc (e.g., CD-ROM, DVD-ROM, etc.) and as a computer data signal embodied in a computer usable (e.g., readable) transmission medium (e.g., carrier wave or any other medium including digital, optical or analog-based medium). As such, the code can be transmitted over communication networks including the Internet and intranets. It is understood that the functions accomplished and/or structure provided by the invention as described above can be represented in a core that is embodied in program code and may be transformed to hardware as part of the production of integrated circuits. Also, the invention may be embodied as a combination of hardware and software.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

We claim:

1. A system for designing a configurable integrated circuit, the system comprising: a processing device for executing computer code, the computer code adapted to generate a hardware definition language (HDL) description file by selecting from a library of configurable components through a user interface, the processing device further comprising an optimizing module to optimize selected parameters of at least one of the selected configurable components by modifying the generation of the description file, the optimization based on application specific requirements specified through the user interface, said optimizing module making a determination to cause a first set of functions of the configurable integrated circuit to be implemented in software and a second set of functions of the configurable integrated circuit to be implemented in hardware, wherein the description file is converted to an output file that describes a foundry specific layout of the integrated circuit.

2. The system of claim 1 wherein the optimizing module further comprises a workload analysis module adapted to configure the configurable components to optimize at least one parameter of at least one of the selected configurable components.

3. The system of claim 2 wherein the optimizing module further comprises an operating system analysis module adapted to optimize an operating system features based on an analysis of the workload.

4. The system of claim 1 wherein the selected parameters are iteratively optimized in response to an analysis of workload and operating system features.

5. The system of claim 4 further comprising a set of tools for selectively synthesizing or verifying the design of the optimized configurable integrated circuit.

6. The system of claim 5 further comprising associating the result of the synthesis with the optimizing module to further modify the description file.

7. The system of claim 1 further comprising a mechanism that send the output file to a selected semiconductor foundry for producing the integrated circuit.

8. The system of claim 7 wherein the computer code, description file and the sending mechanism are hosted in a data center.

9. The system of claim 1 wherein the configurable components comprise synthesizable intellectual property (IP) blocks that are accessed through the user interface.

10. The system of claim 1 wherein the user interface includes a reference area and a work palette.

11. The system of claim 10 wherein selected components are configured and interconnected using graphical indicators, associated with at least one selected component, that appear when the selected component is instantiated in the work palate.

12. The system of claim 1 wherein the parameter optimization selects at least one component from the library of components in response to at least one of a set of integrated circuit specifications, a set of application software specifications, and a set of operating system specifications.

13. The system of claim 1 wherein the parameter optimization instantiates at least one component in integrated circuit to minimize the storage requirements of the operating system.

14. The system of claim 1 wherein the parameter optimization removes at least one instantiated component from the description of the integrated circuit and the functionality of the removed component is provided by executing computer code.

15. A computer-implemented method for designing a configurable integrated circuit, the computer-implemented method comprising:

generating at least one hardware definition language (HDL) description file selected from a library of configurable components using the computer; and optimizing parameters of at least one of the selected configurable components by modifying the description file based on application specific requirements specified through a user interface, said optimizing being performed using the computer and making a determination to cause a first set of functions of the configurable integrated circuit to be implemented in software and a second set of functions of the configurable integrated circuit to be implemented in hardware.

16. The method of claim 15 further comprising generating an output file that describes a foundry specific layout of the integrated circuit, and sending the output file to a selected semiconductor foundry for producing the integrated circuit.

17. The method of claim 15 further comprising analyzing application software and optimizing parameters of at least one of the selected configurable components based on the analysis.

18. The method of claim 17 further comprising optimizing operating system in response to the instructions provided by the application software mechanism.

19. The method of claim 15 further comprising analyzing application software and the operating system and, based on the analysis, optimizing parameters of at least one of the selected configurable components.

20. The method of claim 15 further comprising selectively synthesizing or verifying the design of the optimized configurable integrated circuit.

21. The method of claim 15 further comprises using graphical indicators to select and interconnect configurable components.

22. The method of claim 15 further comprising selecting components from a library of components in response to integrated circuit specifications, application software specifications, and operating system specifications.

23. The method of claim 15 wherein the parameter optimizing instantiates a component in the configurable integrated circuit to minimize the footprint of the operating system.

24. The method of claim 15 wherein the parameter optimizing removes a component from the integrated circuit to minimize the die size of the integrated circuit and move the component functionality to either the application software or to the operating system.

25. A computer-implemented method of designing an integrated circuits (IC), the computer-implemented method comprising:

adjusting, in an automated fashion, software and hardware parameters to thereby define the design of the integrated circuit using the computer, wherein the adjusting is performed using one of a plurality of design tools;

simulating the performance of the integrated circuit using the computer, wherein the simulation is performed using one of a plurality of simulation tools; and in response to the simulation, optimizing the design of the integrated circuit for at least one selected parameter, wherein the optimizing is performed using one of a plurality of optimizing tools, said optimizing making a determination to cause a first set of functions of the integrated circuit to be implemented in software and a second set of functions of the integrated circuit to be implemented in hardware.

26. The system of claim 1 wherein the HDL description file is modified in accordance with the determination made by the optimization module.

27. The method of claim 15 further comprising:

modifying the HDL description file in accordance with the determination made by said optimizing.

28. The computer-implemented method of claim 25 further comprising:

generating at least one hardware definition language (HDL) description file characterized by a plurality of configurable components selected from a library; and modifying the HDL description file in accordance with the determination made by said optimizing.

* * * * *